United States Patent
Fu

(10) Patent No.: US 12,228,590 B2
(45) Date of Patent: Feb. 18, 2025

(54) WAFER PROBE DEVICE

(71) Applicant: Winbond Electronics Corp., Taichung (TW)

(72) Inventor: Ting-Ming Fu, Hsinchu County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 18/470,193

(22) Filed: Sep. 19, 2023

(65) Prior Publication Data

US 2024/0003939 A1     Jan. 4, 2024

Related U.S. Application Data

(62) Division of application No. 17/354,224, filed on Jun. 22, 2021, now Pat. No. 11,796,566.

(30) Foreign Application Priority Data

Oct. 15, 2020   (TW) .................. 109135673

(51) Int. Cl.
| | |
|---|---|
| G01R 1/073 | (2006.01) |
| G01R 1/02 | (2006.01) |
| G01R 1/04 | (2006.01) |
| G01R 1/067 | (2006.01) |
| G01R 31/00 | (2006.01) |
| G01R 31/26 | (2020.01) |
| G01R 31/28 | (2006.01) |
| H01L 21/683 | (2006.01) |

(52) U.S. Cl.
CPC ..... G01R 1/07342 (2013.01); G01R 31/2887 (2013.01); H01L 21/6833 (2013.01)

(58) Field of Classification Search
CPC . G01R 1/02; G01R 1/04; G01R 1/067; G01R 1/073; G01R 1/20; G01R 31/00; G01R 31/02; G01R 31/26; G01R 31/28; G01R 31/31

See application file for complete search history.

(56) References Cited

U.S. PATENT DOCUMENTS

| | | | |
|---|---|---|---|
| 5,321,453 A | 6/1994 | Mori et al. | |
| 5,404,111 A * | 4/1995 | Mori | G01R 1/07314 324/754.07 |

FOREIGN PATENT DOCUMENTS

| | | |
|---|---|---|
| CN | 1975439 B | 5/2010 |
| JP | H0541423 | 2/1993 |
| JP | 2005079219 | 3/2005 |
| TW | M601346 U | 9/2020 |

* cited by examiner

*Primary Examiner* — Neel D Shah
(74) *Attorney, Agent, or Firm* — MUNCY, GEISSLER, OLDS & LOWE, P.C.

(57) ABSTRACT

An wafer probe device is provided, including a holder, and a probe card. The holder has a holding surface for holding a wafer. The probe card has a probing side for probing the wafer. Wherein the holder and the probe card are disposed on the ground, and the holding surface of the holder and the probing side of the probe card are perpendicular to the ground. Wherein when the holder holds the wafer to move upwardly toward the probe card into a probing position, the probed surface of the wafer is in contact with the probe card, and the probe surface is perpendicular to the ground.

15 Claims, 9 Drawing Sheets

WAFER PROBE DEVICE

CROSS REFERENCE TO RELATED APPLICATIONS

This application is a Divisional of pending U.S. patent application Ser. No. 17/354,224, filed Jun. 22, 2021 and entitled "WAFER PROBE DEVICE", which claims priority of Taiwan Patent Application No. 109135673, filed on Oct. 15, 2020, the entirety of which is incorporated by reference herein.

BACKGROUND OF THE INVENTION

Field of the Invention

The present disclosure relates to a wafer probe device, and, in particular, to a wafer probe device that includes a holder and a probe card.

Description of the Related Art

Generally, the structure of a conventional wafer probing machine usually placed the wafer at a loading port, taking out from a wafer cassette by a transfer mechanism. The wafer is placed on a chuck after correction, and moving the chuck upward to a corresponding position to allow the probe apparatus to conduct electrical testing. The size and weight of the probe heads of the probe apparatus may vary to meet product requirements. Simple examples include the Single DUT Cantilever Probe Card and the Wafer Acceptance Test (WAT). A more complex example is the CPU Wafer test. Usually, in order to be able to handle various wafer tests, the probe apparatus must be made strong enough.

In cases with a large amount of chips, the diameter of the probe head is larger and heavier. In the old test process, the probe head is locked on the inner ring manually, and is in contact with a testing apparatus linking between the tester interface board and the probe card (such as POGO Tower, by 'Turbodynamics') or the probe head is placed on an auto probe card changer (APC), and is loaded automatically by the probe. However, the configuration of these apparatuses may not be consistent with human factors engineering. For example, a risk in handling it is that the downward probe may not be seen. As for these test processes, debris from friction may accumulate on the wafer, causing the risk of probe striking. In addition, for the maintenance of the probe apparatus, another mechanical apparatus is often required to move it before it may be processed, and it needs to be re-set after processing. Therefore, how to provide a better wafer-probing tool is an important issue.

BRIEF SUMMARY OF THE INVENTION

An embodiment of the present invention provides a wafer probe device, including a holder, and a probe card. The holder has a holding surface for holding a wafer. The probe card has a probing side for probing the wafer. Wherein the holder and the probe card are disposed on the ground, and the holding surface of the holder and the probing side of the probe card are perpendicular to the ground. Wherein when the holder holds the wafer to move upwardly toward the probe card into a probing position, the probed surface of the wafer is in contact with the probe card, and the probe surface is perpendicular to the ground.

In one embodiment, the holder is an electrostatic chuck, and when the electrostatic chuck sucks the wafer, a central axis of the electrostatic chuck is parallel to the ground, the probe card includes a probe assembly, the probe assembly is located on the probing side of the probe card for probing the wafer, when the probe card probes the wafer, the extension direction of the probe assembly is parallel to the ground and is parallel to the central axis of the holder, the probe card is unmovably disposed on the ground, the wafer probe device further includes a transportation module, wherein the transportation module is configured to transport the wafer to the holder, the holder includes a main body and a holder assembly, wherein the holder assembly is movably disposed around the main body, when the transportation module transports the wafer to the holder, the holder assembly carries the wafer and moves toward the body. In one embodiment, a back side of the wafer abuts the main body of the holder, the back side of the wafer is opposite to the probed surface. In one embodiment, the holder assembly includes a plurality of holding members disposed around the main body, and each of the holding members is in an L-shaped structure and has a bearing section, wherein the bearing section is parallel to the main body of the holder and is used for carrying the wafer, the holder includes a main body and a suction assembly, and the suction assembly is disposed on the main body and is movable relative to the main body, the suction assembly extends along a central axis of the holder, when the transportation module transports the wafer to the holder, the suction assembly sucks the back side of the wafer. In one embodiment, the back side is opposite to the probed surface, the suction assembly moves toward the main body, the wafer probe device further including a transportation module, and the transportation module is configured to transport the wafer to the holder, the transportation module rotates the wafer from a horizontal state to a vertical state, and the transportation module transports the wafer in the vertical state to the holder, when the wafer is in the vertical state, a center axis of the wafer is parallel to the ground.

BRIEF DESCRIPTION OF THE DRAWINGS

The present invention may be more fully understood by reading the subsequent detailed description and examples with references made to the accompanying drawings, wherein.

DETAILED DESCRIPTION OF THE INVENTION

Figure 1:
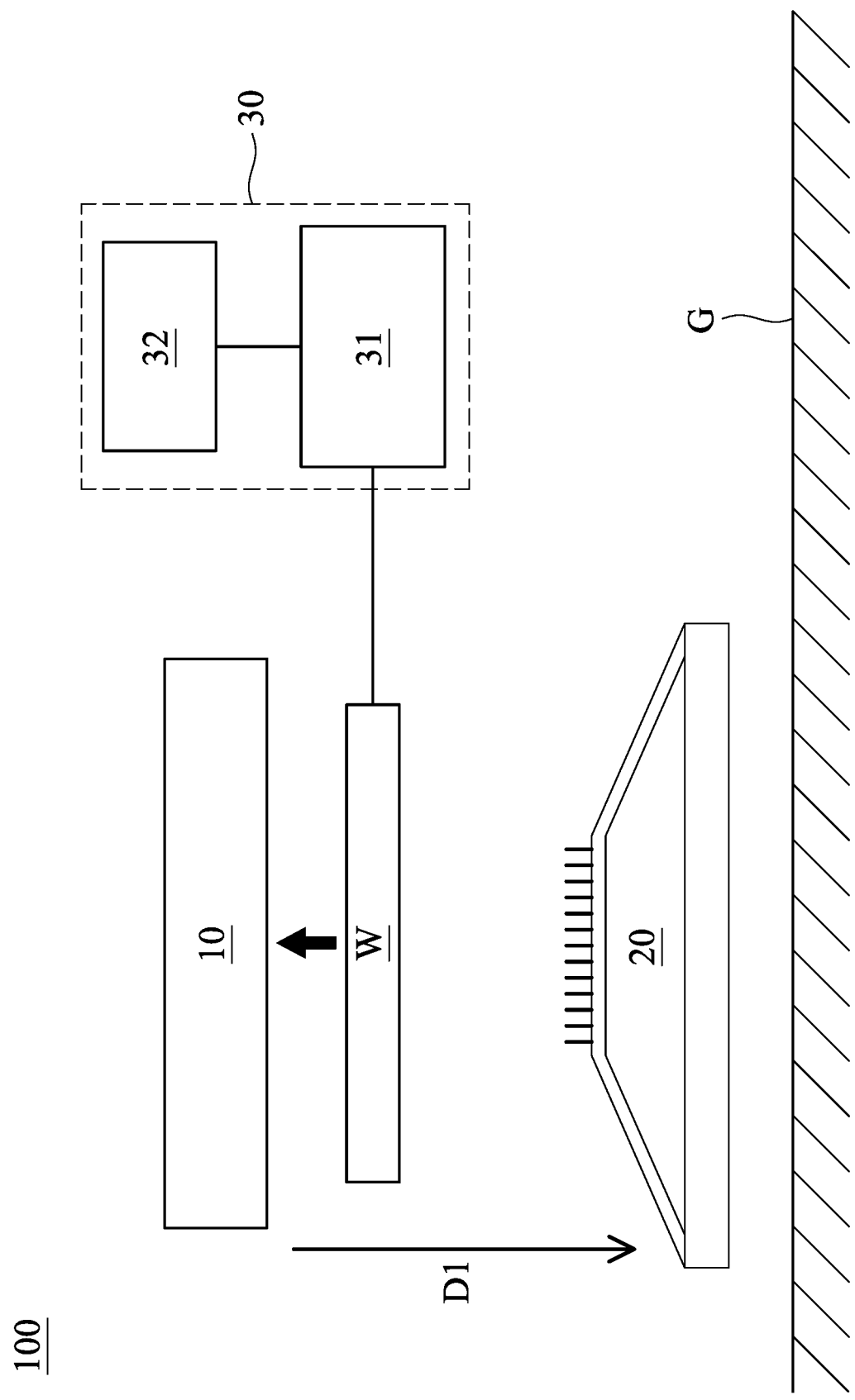
FIG. 1 shows a schematic view of a wafer probe device according to an embodiment of the present disclosure.

Please refer to FIG. 1, which shows a schematic view of a wafer probe device 100 according to an embodiment of the present disclosure, the wafer probe device 100, for example, may be used for probing process for a semiconductor wafer. Through the wafer probe device 100, the characteristics may be probed before the post-process to confirm whether there is a defective product or not. The structure of the wafer probe device 100 will be described in detail below.

Please continue to refer to FIG. 1, the wafer probe device 100 includes a holder and a probe card 20 for probing a probed surface W1 of the wafer W. The holder 10 is used to hold the wafer W and to move the wafer W to the probe card 20 for testing, the wafer probe device 100 further includes a transportation module 30. For example, the wafers W is transported to the holder 10 using the transportation module 30, then the wafer W is moved toward the probe card 20 through the holder 10, the transportation module 30 includes a transport member 31 and a control unit 32, and the transport member 31 may be a robotic arm that may hold the back side W2 (opposite to the probed surface W1) of the wafer W for moving. For example, moving the wafer W from the wafer cassette (cassette) to the holder 10. The control unit 32 is for controlling the transport member 31, the transportation module 30 may be regarded as an external apparatus that transfer the wafer W.

In the present embodiment, the probe card 20 is disposed on the ground G, and the holder 10 is located above the probe card 20, or the probe card 20 is located above the holder 10. The holder is farther from the ground G when comparing to the probe card 20. The wafer W to be probed is located between the holder 10 and the probe card 20. The probe card 20 has a probe assembly 21, which located at a probing side 20S1 of the probe card 20. The probe assembly 21 extends away or faces away from the ground G, and extends towards holder 10. The probing side 20S1 faces away from the ground G.

Figure 2A:
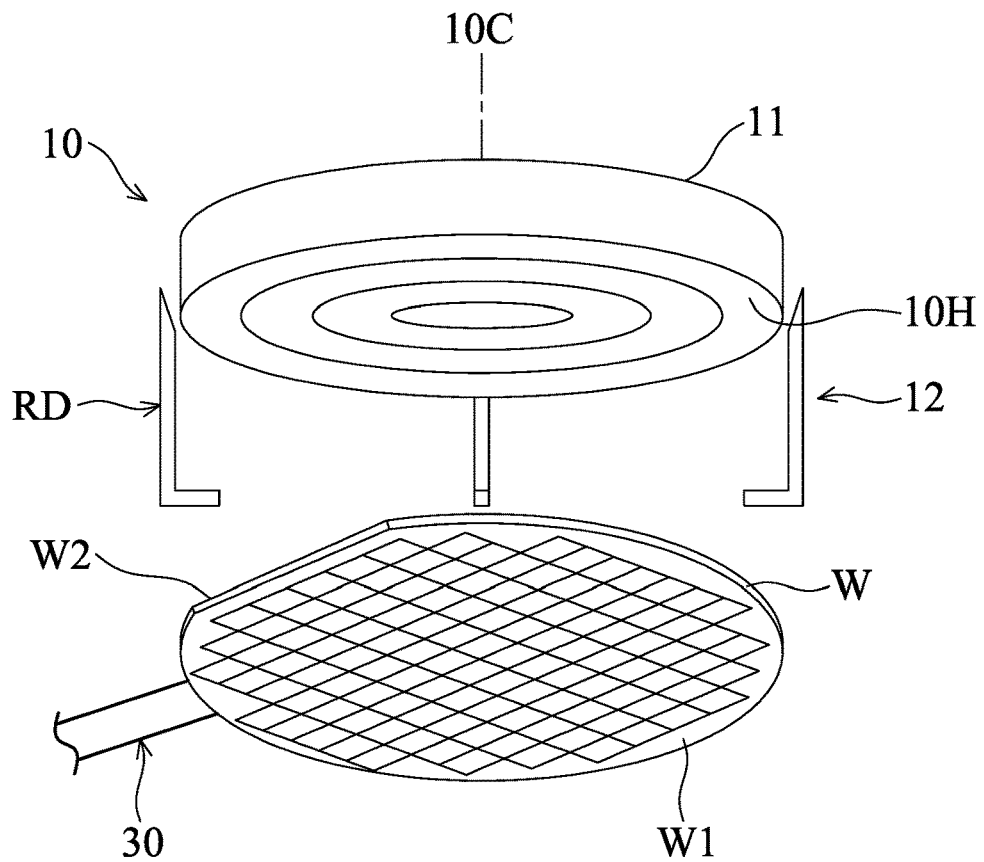
FIGS. 2A-2D show schematic views of a holder, a transportation module and a wafer of FIG. 1.

FIGS. 2A-2D show schematic views of the holder 10 holding the wafer W. As shown in FIG. 2A, in the present embodiment, the holder 10 has a main body 11 and a holder assembly 12. The holder assembly 12 is disposed around the periphery of the main body 11. The holder assembly 12 extends along the central axis 10C of the holder 10, and the holder assembly 12 may move relative to the main body 11. Specifically, the holder assembly 12 has a plurality (in the present embodiment, three) holding members RD disposed around the main body 11, if the main body 11 is regarded as a clock with a circular structure, the holding members RD are located at the three o'clock, six o'clock, and nine o'clock positions of the clock, respectively.

Figure 2B:
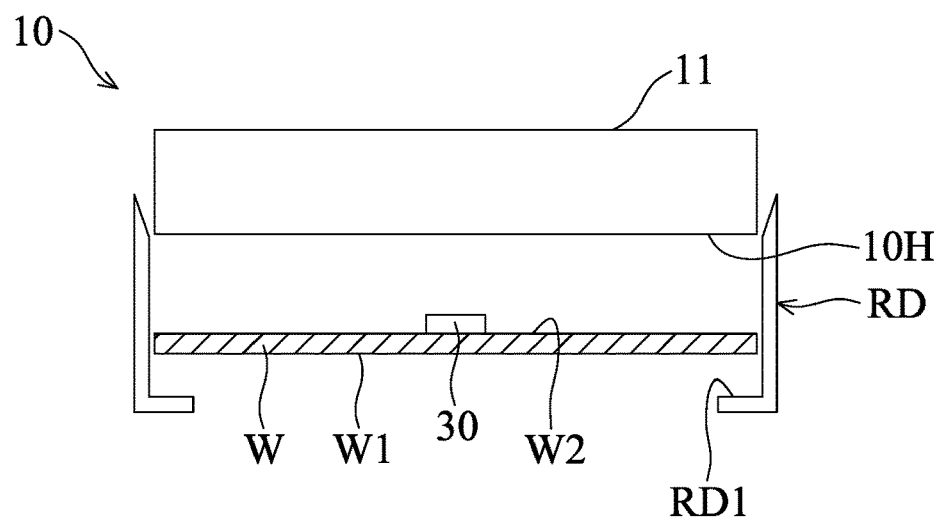

The holding member RD is in an L-shaped structure, and the holding member RD includes a bearing section RD1. As shown in FIG. 2B, when the holder 10 is not carrying or holding the wafer W, the holder assembly 12 projects from the main body 11 toward the probe card 20 or the ground G. As the held position in FIG. 2B, when moving the wafer W to the holder 10 by the transportation module 30, the wafer W is placed on the bearing section RD1 of each holding members RD via the transport member 31; or the holding member RD moves, and the bearing section RD1 is moved toward the wafer W. Thus, the wafer W is carried by the holding member, and the transportation module 30 may disconnected from the wafer W.

Figure 2C:
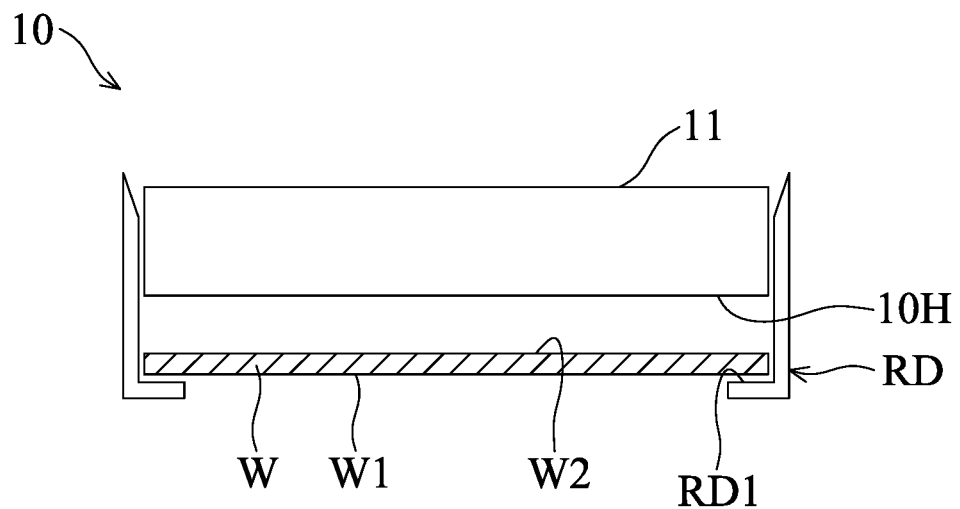
Figure 2D:
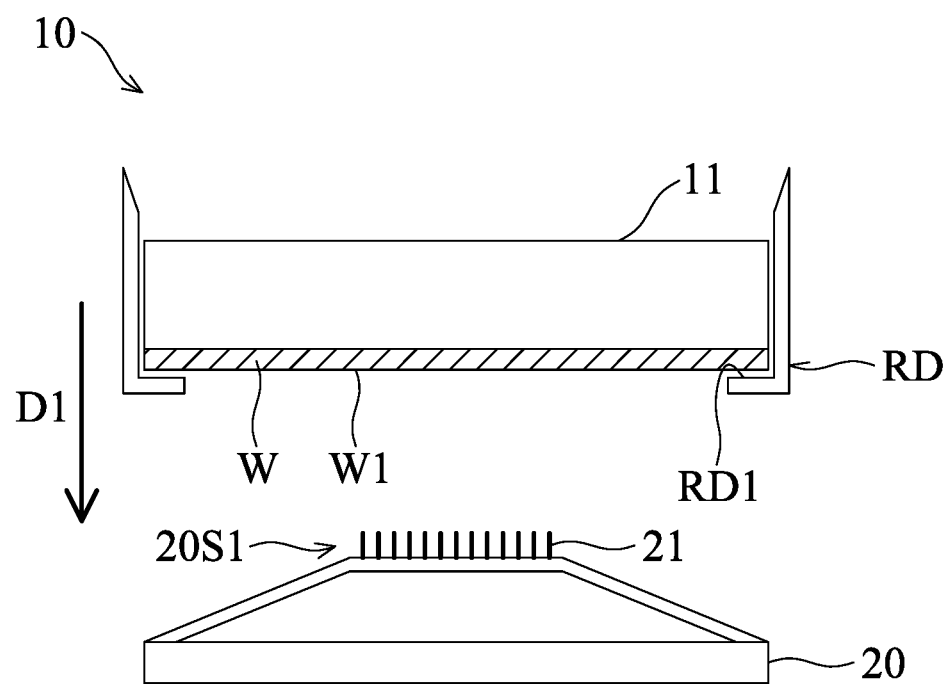

Next, as shown in FIG. 2C, the holding members RD that carries the wafer W moves upwardly toward the main body W, or moves away from the probe card 20 or the ground G to make the back side W2 of the wafer W abut against the main body 11. As shown in FIG. 3D, at this time, one may be regarded that a holding surface 10H of the holder 10 is holds and carries the wafer W. In this way, the holder 10 holds the wafer W firmly. Then, the holder 10 may move the wafer W toward the probe card 20, such as the moving direction D1, to probe the wafer W.

In this way, the probing efficiency may be improved through moving the holder above the probe card 20. For example, the probe card 20 may be design to big enough when facing different wafer probing with various sizes and shapes. The setup mechanism of the probe card 20 may be simplified and it is unnecessary to move the probe card by setting-up mechanism with the ground G disposed below. Therefore, the time and efficiency of the probe procedure is improved. In addition, the wafer W and the probe card may be directly viewed when the wafer W and the probe card 20 are set for probing since the wafer W is held by the holder 10 to move downwardly toward the probe card 20. This reduces the risk of operation, for example, the damage to the probed surface W1 of the wafer W is avoided or reduced. Furthermore, since the probe card 20 probes the wafer W upwardly, the fragment generated due to friction when probing may fall down due to gravity. Compared with probing the wafer with the probe card downward, the fragment may be prevented from accumulated on the wafer W, and the risk of probe striking is avoided, thereby the quality of the process is greatly improved.

FIGS. 3A-3D show schematic views of the holder 10 holding the wafer W of another embodiment. In the present embodiment, the holder 10 has an suction assembly 13, which is disposed within the main body 11 of the holder 10. The suction assembly 13 extends along the central axis 10C of the holder 10, and the suction assembly 13 may move relative to the main body 11. The suction assembly 13 is for sucking the back side W2 of the wafer W.

Figure 3A:
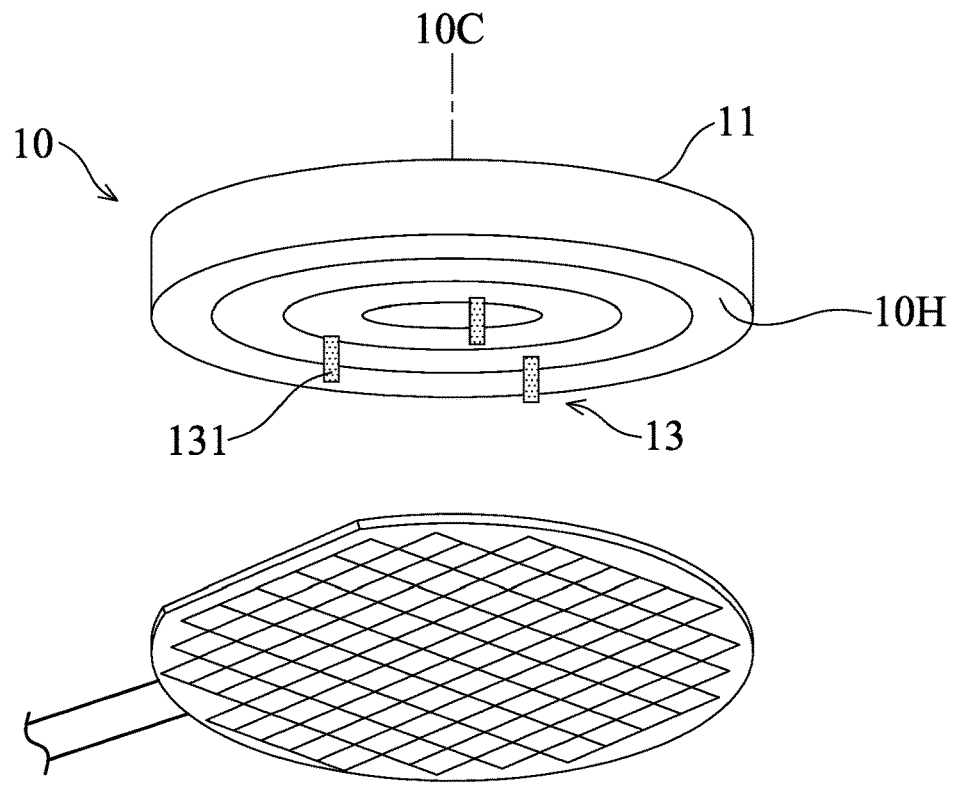
FIGS. 3A-3D and 4A-4B show schematic views of the holder, the transportation module and the wafer of different embodiments.
Figure 3B:
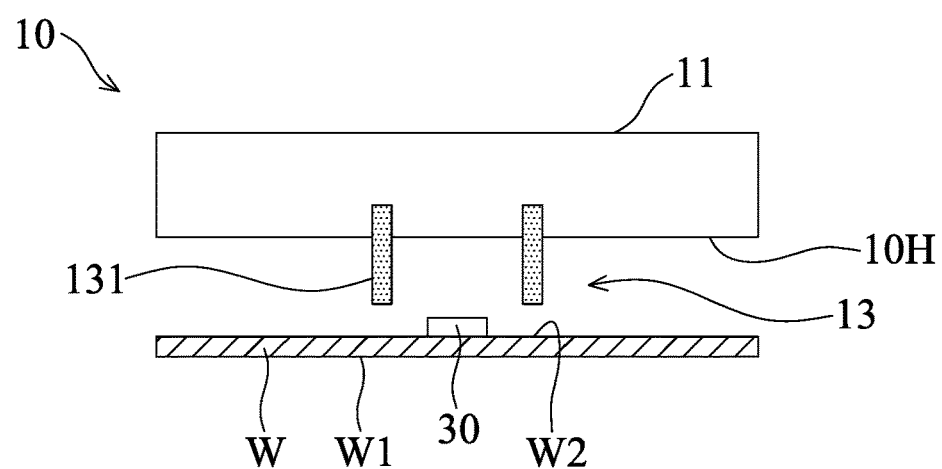
Figure 3C:
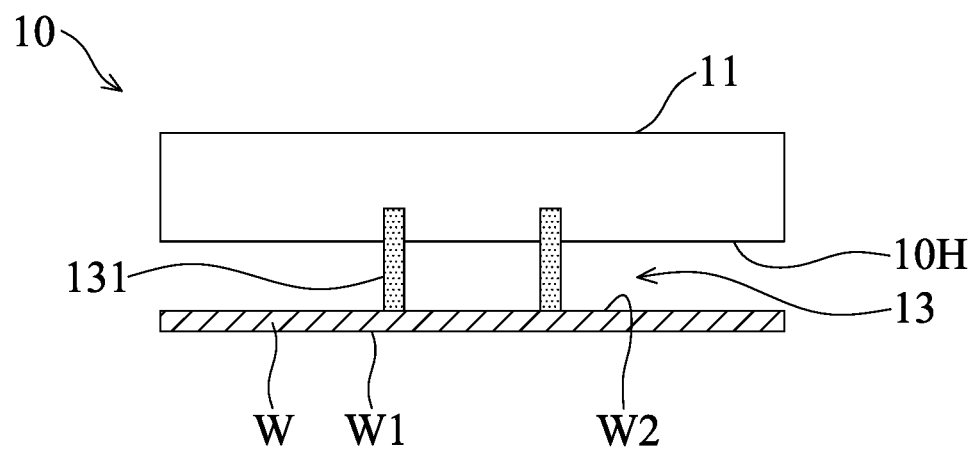
Figure 3D:
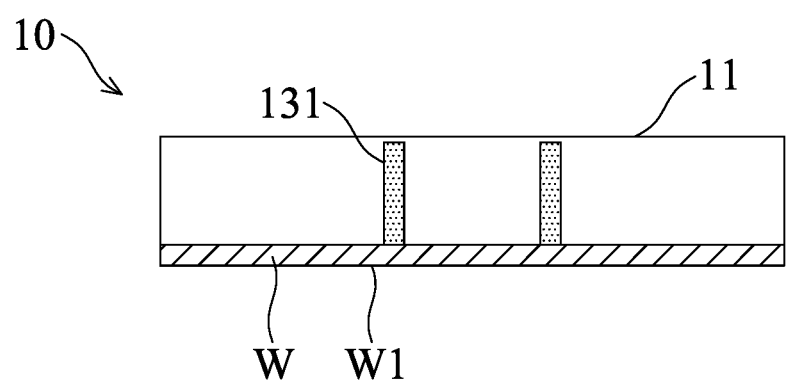

As shown in FIGS. 3A and 3B, the suction assembly 13 projects from the main body 11 and the back side W2 of the wafer W is sucked by the suction assembly 13 when transporting the wafer W to the holder 10 by the transportation module 30. Thus, the transportation module 30 transfers the wafer W to the holder 10 and exits. Thereafter, as shown in FIGS. 3C and 3D, the suction assembly 13 moves toward the main body 11 of the holder 10 to allow the main body 11 carry the wafer W stably. At this time, it may be regarded that the holding surface 10H of the holder 10 holds and carries the wafer W. Thereafter, the holder 10 may move the wafer W toward the probe card 20 to probe the wafer W.

In the present embodiment, the suction assembly 13 has a plurality of (three) of the suction heads 131 assembly for absorbing the wafer W, the suction assembly 13 may have other numbers of suction heads 131, for example, one, two, or four suction heads, the suction head 131 of the suction assembly 13 sucks the back side W2 of the wafer W through vacuum suction.

Figure 4A:
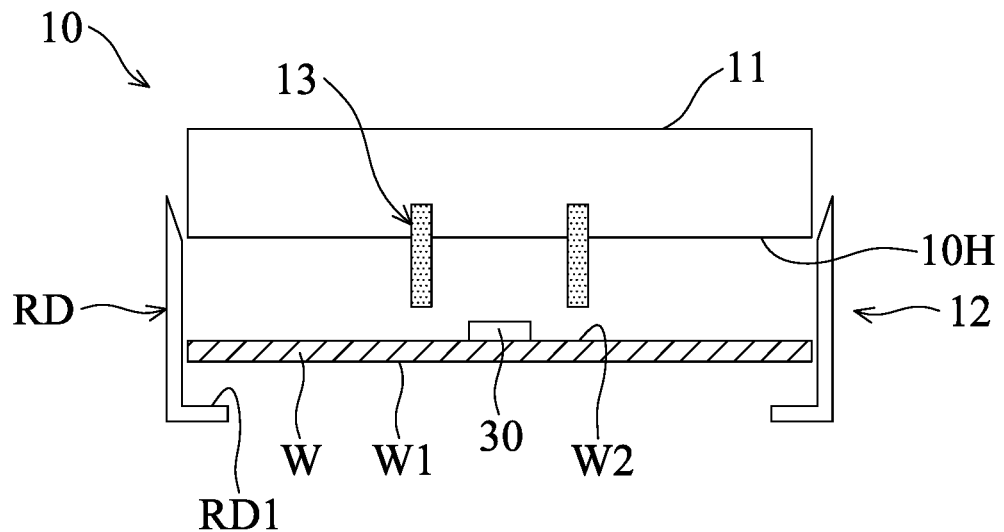
Figure 4B:
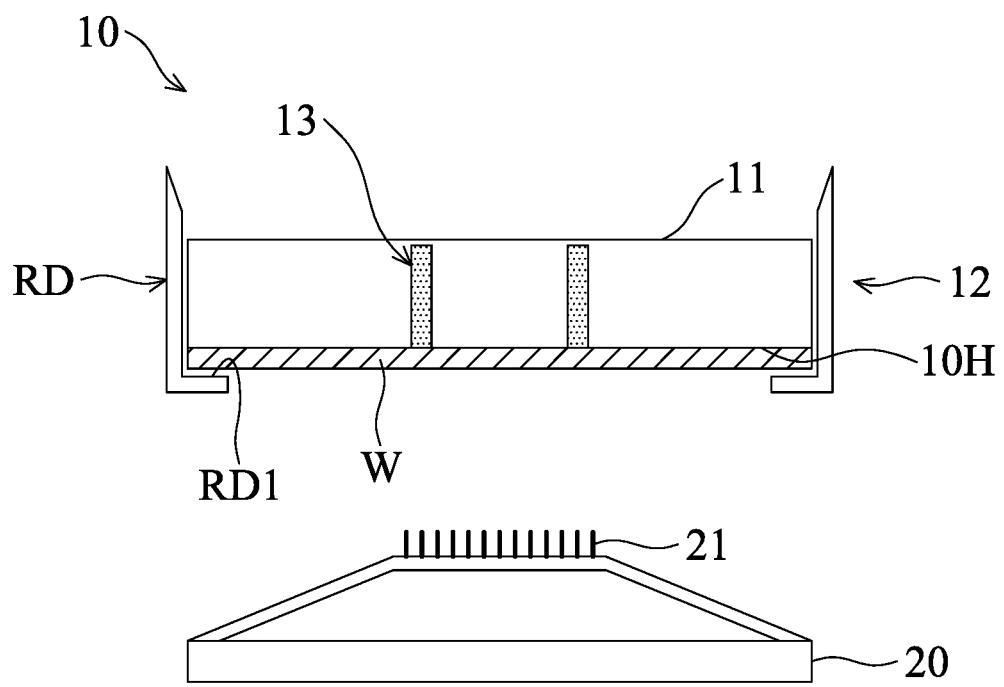

FIGS. 4A-4B show schematic views of the holder 10 including a holder assembly 12 and an suction assembly 13 of another embodiment. When transporting the wafer W to the holder 10 by the transportation module 30, the wafer W is disposed at the bearing section RD1 of the holder assembly 12, or the bearing section RD1 of the holder assembly 12 is moved to the wafer W at the corresponding position by the transportation module, so as to carry the wafer W. Moreover, the back side W2 of the wafer W is sucked by the suction assembly 13 and is moved toward the main body 11 of the holder 10.

Figure 5:
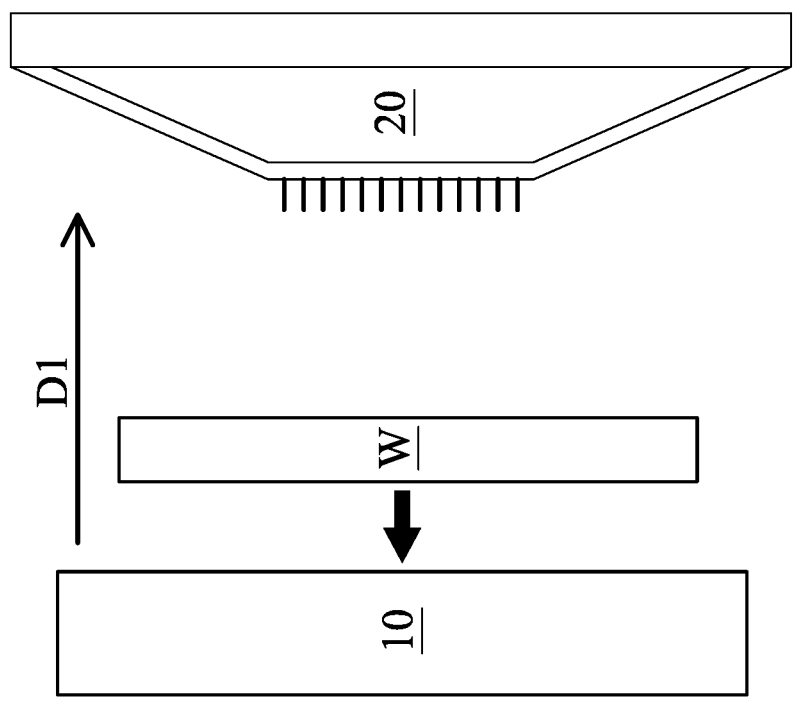
FIG. 5 shows a schematic view of the wafer probe device according to another embodiment of the present disclosure.
Figure 5:
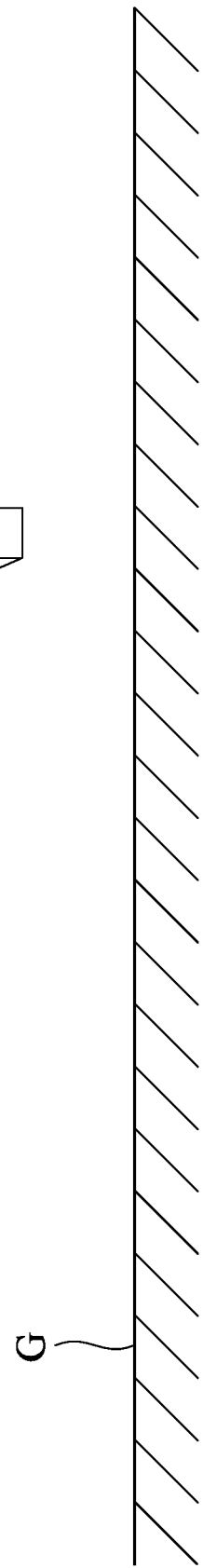

FIG. 5 shows a schematic view of a wafer probe device 200 according to another embodiment of the present disclosure. The wafer probe device 200 of the present embodiment performs wafer probing in a vertical manner. The wafer probe device 200 includes a holder 10, a probe card 20, and a transportation module 30. The wafer W may be probed through the wafer probe device 200. The details of the wafer probe device 200 will be described in detail below.

Figure 6A:
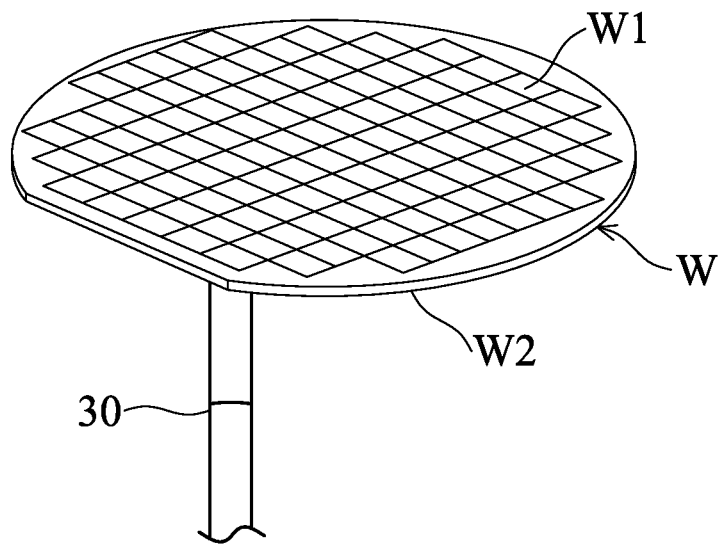
FIGS. 6A-6D show schematic views of the holder, the transportation module and the wafer of FIG. 5.
Figure 6B:
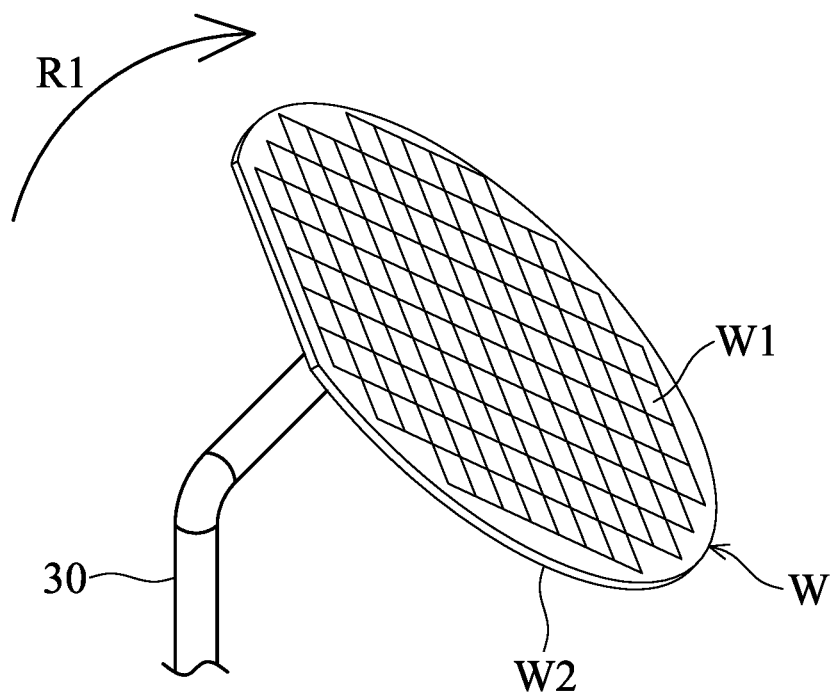

Please refer to FIGS. 6A and 6B, the abovementioned transportation module 30 is for transporting the wafer W to the holder 10, wherein the transportation module 30 holds the back side of the wafer W. The wafer W is rotated from the horizontal state to the vertical state, such as the rotation direction R1, before rotating the wafer W, pre-alignment may be performed.

Figure 6C:
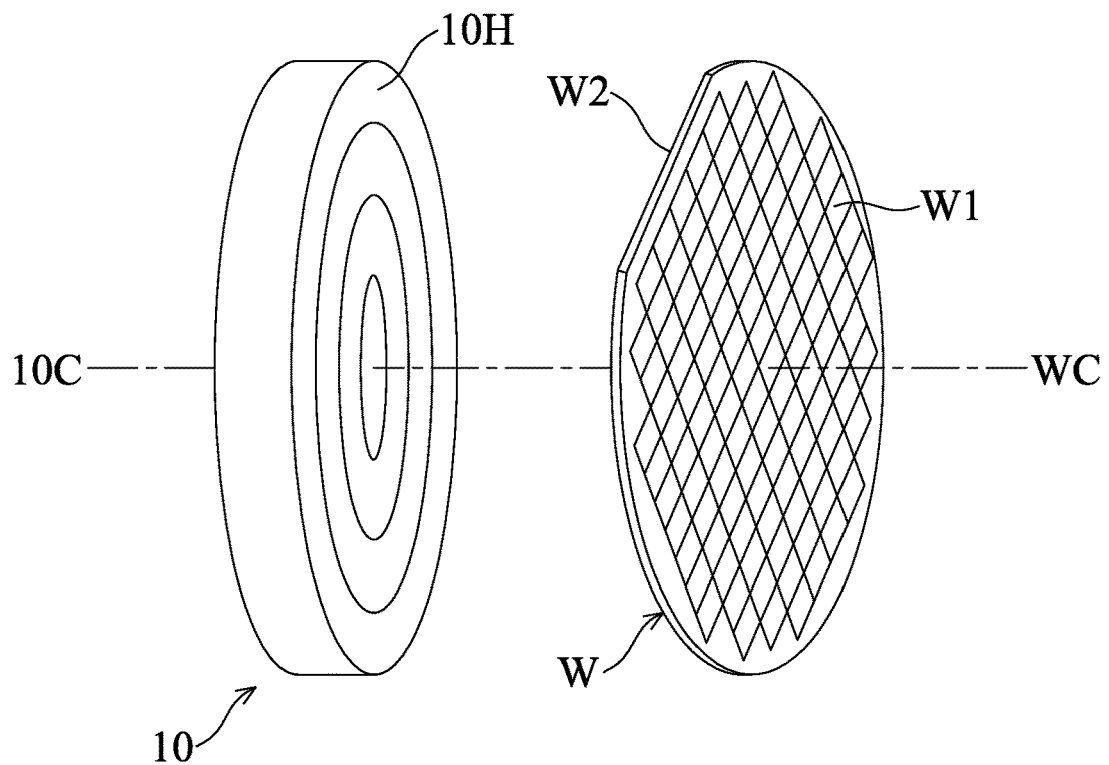
Figure 6D:
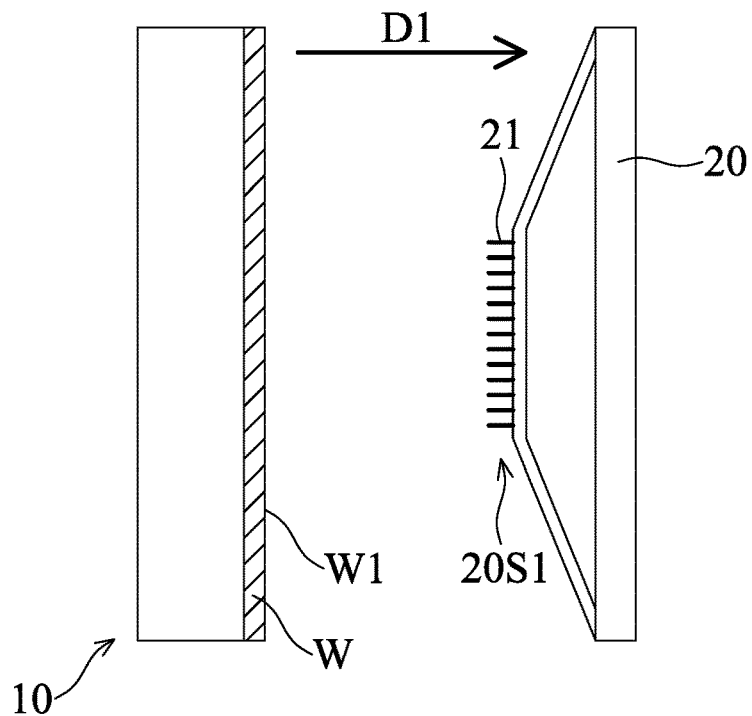

Next, as shown in FIG. 6C, the wafer W in the vertical state is placed on the holder 10, or the holder 10 is moved close to the wafer W, so that the holder 10 holds the wafer W, such as holds through the holding surface 10H of the holder. Thereafter, as shown in FIG. 6D, the wafer W is moved horizontally to the probe card 20 by the holder 10, such as along the moving direction D1, to perform the wafer probe procedure, before moved the wafer W horizontally to the probe card 20, performing the alignment of wafer W with the probe assembly 21.

In some embodiments, the holder 10 may be an electrostatic chuck (E-Chuck) for providing a bias and for generating suction force, the holding surface 10H of which has a copper wire. The copper wire may polarize the surface layer by voltage electric field and generate the suction force at the surface of the sucked object for holding. Thus, even if an abnormality of the power supply to the process plant occurs, the wafer W may still be sucked, the electrostatic chuck may use different of substrate materials, such as stainless steel, aluminum, glass, synthetic plastic.

It should be noted that the transportation module 30 turns the wafer W into vertical state (relative to the ground G) and then delivers it to the holder 10. While the standing holder 10 (relative to the ground G) may be pushed horizontally to the probe card and the extending direction of the probe assembly 21 of the probe card 20 is parallel to the ground G, or is parallel to the central axis 10C of the holder 10. Thus, since the holder is in the standing state, the holding surface 10H of the holder 10 that holds the wafer W is perpendicular to (or considered as substantially perpendicular to, for example, between +5 degrees to −5 degrees) the ground G. This allows directly observation of the overall condition during operation, which is helpful for probing.

In addition, since the objects are in an upright state, that is, the central axis 10C of the holder 10, the central axis WC of the wafer W and the extending direction of the probe 21 of the probe card are parallel to the ground G (or considered as substantially parallel to, for example, between +5 degrees to −5 degrees). The accumulation of the debris on the wafer W or the probe card 20 may be avoided the contact between the elements when the debris is generated. In addition, under the high-temperature test process, the hot air escapes upwardly. Compared with the traditional probe card 20 disposed above the holder 10, the probe card 20 may be affected by the hot air, which may cause warpage, probe expansion, and probe deformation. The abovementioned problems may be effectively avoided.

In other embodiments, different holding disks and test tools may be used. For example, the horizontal wafers W placed in the JEDEC tray is taken out and put into the test tray (T-Tray) through the transport assembly 30. The test tray is rotated for 90 degrees, so that the wafer W is in the horizontal state, and the wafer W is then horizontally pushed toward the Hi-Fix Socket for probing. After completing the probing, the test tray is rotated to turn the probed wafer W back to the horizontal state, and the wafer W is then put back to the JEDEC tray.

According to the foregoing embodiment, the present disclosure also provides a method for probing wafers. The method includes transferring or transporting the wafer to a holder by a transportation module, and the holder holds the wafer to move toward a probe card for probing process.

In some embodiments, the method for probing wafers further includes transporting the wafer to the holder assembly of the holder by the transportation module. The holder assembly moves toward the main body of the holder after carrying the holder assembly, letting the back side of the wafer abuts the main body, and moving the wafer toward the probe card by the holder, the method for probing wafers further includes transporting the wafer to the holder by the transporting module, sucking the back side of the wafer through the suction assembly of the holder and moving toward the main body of the holder, so that the back side of the wafer abuts the main body. The wafer is moved toward the probe card by the holder.

In some other embodiments, the method for probing wafers further includes transporting the wafer to the holder assembly of the holder by the transportation module. The holder assembly moves toward the main body of the holder after carrying the wafer, and the suction assembly of the holder sucks the back side of the wafer. The holder assembly and the suction assembly move toward the main body of the holder, so that the back side of the wafer abuts the main body, and the holder carries the wafer to move toward the probe card.

In some embodiments, the method for probing wafers further includes detecting wafer rotating the wafer from the horizontal state to the vertical (or upright) state (relative to the ground), then placing the wafer on the holder. The holder sucks the back side of the wafer, wherein the central axes of the holder and the wafer are parallel to the ground, the holder moves the wafer to toward the probe card along the central axis, wherein the extending direction of the probe of the probe card is parallel to the ground.

It should be noted that the features of various embodiments may be combined and used as long as they do not depart from or conflict to the spirit and the scope of the present disclosure. For example, the holder 10 in FIG. 1 may be an electrostatic chuck; the holder 10 in FIG. 5 may be mounted with the holder assembly 12.

In summary, An embodiment of the present invention provides a wafer probe device, including: a holder, for holding a wafer; and a probe card, disposed on a ground, located between the holder and the ground, and located below the holder, with a probing side of the probe card facing away from the ground. The holder holds the wafer to move toward the probe card, and a probed surface of the wafer is in contact with the probe card.

Another embodiment of the present disclosure provides a wafer probe device, including: a holder, having a holding surface, for holding a wafer; and a probe card, having a probing side, for probing the wafer. Wherein the holder and the probe card are disposed on the ground, and the holding surface of the holder and the probing side of the probe card are perpendicular to the ground. When the holder holds the wafer to move upwardly toward the probe card into a probing position, the probed surface of the wafer is in contact with the probe card, and the probe surface is perpendicular to the ground.

The abovementioned embodiments are described in sufficient detail, so that a person with ordinary skill in the art to which the invention belongs may implement the devices disclosed in this disclosure with the above description, and it must be understood that modifications and variations may be made without departing from the spirit and scope of the present disclosure. Therefore, the scope of protection of the present disclosure depends on the scope defined by the appended claims.

What is claimed is:

1. A wafer probe device, comprising:
a holder, having a holding surface, for holding a wafer;
a probe card, having a probing side, for probing the wafer, wherein the holder and the probe card are disposed on the ground, and the holding surface of the holder and the probing side of the probe card are perpendicular to the ground; and
a transportation module, configured to transport the wafer to the holder,
wherein when the holder holds the wafer to move upwardly toward the probe card into a probing position, a probed surface of the wafer is in contact with the probe card, and the probed surface is perpendicular to the ground,
wherein the holder comprises a main body and a holder assembly, wherein the holder assembly is movably disposed around the main body,
wherein the holder assembly comprises a plurality of holding members disposed around the main body, and each of the holding members is in an L-shaped structure and has a bearing section, wherein the bearing section is parallel to the main body of the holder and is used for carrying the wafer.

2. The wafer probe device as claimed in claim 1, wherein the holder is an electrostatic chuck, and when the electrostatic chuck sucks the wafer, a central axis of the electrostatic chuck is parallel to the ground.

3. The wafer probe device as claimed in claim 1, wherein the probe card comprises a probe assembly, the probe assembly is located on the probing side of the probe card for probing the wafer.

4. The wafer probe device as claimed in claim 3, wherein when the probe card probes the wafer, an extension direction of the probe assembly is parallel to the ground and is parallel to a central axis of the holder.

5. The wafer probe device as claimed in claim 1, wherein the probe card is unmovably disposed on the ground.

6. The wafer probe device as claimed in claim 1, wherein when the transportation module transports the wafer to the holder, the holder assembly carries the wafer and moves toward the main body.

7. The wafer probe device as claimed in claim 1, wherein a back side of the wafer abuts the main body of the holder.

8. The wafer probe device as claimed in claim 7, wherein the back side of the wafer is opposite to the probed surface.

9. The wafer probe device as claimed in claim 8, wherein the transportation module rotates the wafer from a horizontal state to a vertical state, and the transportation module transports the wafer in the vertical state to the holder.

10. The wafer probe device as claimed in claim 9, wherein when the wafer is in the vertical state, a center axis of the wafer is parallel to the ground.

11. The wafer probe device as claimed in claim 1, wherein the holder further comprises a suction assembly, and the suction assembly is disposed on the main body and is movable relative to the main body.

12. The wafer probe device as claimed in claim 11, wherein the suction assembly extends along a central axis of the holder.

13. The wafer probe device as claimed in claim 11, wherein when the transportation module transports the wafer to the holder, the suction assembly sucks a back side of the wafer.

14. The wafer probe device as claimed in claim 13, wherein the back side of the wafer is opposite to the probed surface.

15. The wafer probe device as claimed in claim 13, wherein the suction assembly moves toward the main body.

* * * * *